(12) United States Patent
Thomas et al.

(10) Patent No.: US 11,793,089 B2
(45) Date of Patent: Oct. 17, 2023

(54) DURABLE HYBRID HETEROSTRUCTURES AND METHODS FOR MANUFACTURING THE SAME

(71) Applicant: Microsoft Technology Licensing, LLC, Redmond, WA (US)

(72) Inventors: Candice Fanny Thomas, St-Egrève (FR); Michael James Manfra, West Lafayette, IN (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 356 days.

(21) Appl. No.: 16/577,539

(22) Filed: Sep. 20, 2019

(65) Prior Publication Data

US 2021/0091294 A1    Mar. 25, 2021

(51) Int. Cl.
```
G06N 10/00      (2022.01)
H10N 60/85      (2023.01)
H10N 60/80      (2023.01)
H10N 60/12      (2023.01)
H10N 60/01      (2023.01)
```
(52) U.S. Cl.
CPC ........... *H10N 60/805* (2023.02); *G06N 10/00* (2019.01); *H10N 60/0912* (2023.02); *H10N 60/12* (2023.02); *H10N 60/85* (2023.02)

(58) Field of Classification Search
CPC ..... H01L 39/025; H01L 39/12; H01L 39/223; H01L 39/2493; G06N 10/00
See application file for complete search history.

(56) References Cited

U.S. PATENT DOCUMENTS

| 5,760,463 | A | 6/1998 | Hato |
| 9,040,959 | B2 | 5/2015 | Lutchyn et al. |
| 2009/0289244 | A1 * | 11/2009 | Pryor ................ H01L 21/02636 257/22 |
| 2019/0013457 | A1 * | 1/2019 | Lutchyn ................... H03K 3/38 |
| 2020/0027971 | A1 * | 1/2020 | Freedman ............... H01L 27/18 |
| 2020/0321508 | A1 * | 10/2020 | Hart ....................... H01L 29/155 |

FOREIGN PATENT DOCUMENTS

| WO | WO-2016000836 A1 * | 1/2016 | ........... H01L 29/045 |
| WO | 2017153388 A1 | 9/2017 | |
| WO | 2019074557 A1 | 4/2019 | |

OTHER PUBLICATIONS

Boschini, et al., "High-resolution photoemission study of Co/Si (111) interface formation," Physical Review B, vol. 35, Issue 9, Mar. 1987, The American Physical Society, pp. 4216-4220.

(Continued)

*Primary Examiner* — Christine A Enad
(74) *Attorney, Agent, or Firm* — Withrow & Terranova, PLLC

(57) ABSTRACT

A hybrid heterostructure includes a semiconductor layer comprising indium antimonide, a superconductor layer comprising aluminum, and a screening layer between the semiconductor layer and the superconductor layer, the screening layer comprising indium arsenide. By including a screening layer of indium arsenide between the semiconductor layer of indium antimonide and the superconductor layer of aluminum, a high-performance and durable hybrid heterostructure suitable for use in quantum computing devices is provided.

20 Claims, 8 Drawing Sheets

(56) References Cited

OTHER PUBLICATIONS

Boscherini, F. et al., "Exchange reaction, clustering, and surface segregation at the Al/InSb(110) interface," Physical Review B, vol. 35, No. 18, Jun. 15, 1987, The American Physical Society, pp. 9580-9585.
Kjaergaard, et al., "Quantized Conductance Doubling and Hard Gap in a two-Dimensional Semiconductor-Superconductor Heterostructure", In Repository of arXiv:1603.01852v1, Mar. 6, 2016, 10 Pages.
Lutchyn, et al., "Realizing Majorana Zero Modes in Superconductor-Semiconductor Heterostructures", In Repository of arXiv:1707.04899v1, Jul. 16, 2017, 18 Pages.
"International Search Report and Written Opinion Issued in PCT Application No. PCT/US2020/039737", dated Oct. 27, 2020, 30 Pages.
Plissard, et al., "Formation and Electronic Properties of InSb Nanocrosses", In Journal of Nature nanotechnology, vol. 8, Issue 11, Oct. 13, 2013, 20 Pages.
Suominen, et al., "Scalable Majorana Devices", In Repository of arXiv:1703.03699, Mar. 10, 2017, 14 Pages.
Zino, et al., "Epitaxial Aluminum Contacts to InAs nanowires", In Repository of arXiv:1309.4569, Sep. 18, 2013, 14 Pages.
"Decision to Grant Issued in European Patent Application No. 20743414.3", dated Aug. 3, 2023, 2 Pages.
"Notice of Allowance Issued in European Patent Application No. 20743414.3", dated Apr. 18, 2023, 7 Pages.

\* cited by examiner

| SEMICONDUCTOR | 12 |
|---|---|

FIG. 3A

DURABLE HYBRID HETEROSTRUCTURES AND METHODS FOR MANUFACTURING THE SAME

FIELD OF THE DISCLOSURE

The present disclosure is related to hybrid heterostructures, and in particular to superconductor/semiconductor heterostructures suitable for the implementation of quantum computing devices.

BACKGROUND

Quantum computing is a type of computing in which quantum mechanical phenomena such as quantum state superposition and entanglement are harnessed to perform computations. In a topological quantum computer, calculations are performed by manipulating quasiparticles, which are called non-abelian anyons, which have unique physical properties that allow them to be used to perform quantum calculations.

Hybrid heterostructures such as superconductor/semiconductor heterostructures may be created such that regions of non-abelian anyons are formed in the semiconductor. The non-abelian anyons formed in hybrid heterostructures are often referred to as Majorana zero modes. Control structures such as insulated gates may be used along with a small network of heterostructures to manipulate the non-abelian anyons and thus create quantum computing units such as a quantum bit, or qubit.

In general, it is desirable to have good registry between the atoms in the different materials of a hybrid heterostructure. That is, it is desirable to control the interaction of the different materials at the intersection thereof in a hybrid heterostructure.

One hybrid heterostructure that has been studied for application to quantum computing is aluminum/indium arsenide. Depositing aluminum onto indium arsenide results in a well-defined boundary between the different materials. This in turn allows for the formation of regions of non-abelian anyons. Accordingly, aluminum/indium arsenide nanowires have shown promise for forming functional qubits.

Another hybrid heterostructure that has been studied for application to quantum computing is aluminum/indium antimonide. Depositing aluminum onto indium antimonide does not result in a well-defined boundary between the different materials. After depositing aluminum onto indium antimonide, the aluminum reacts with the indium antimonide, even at room temperature, such that eventually the layer of aluminum is consumed and replaced with a layer of aluminum indium antimonide. In other words, current manufacturing techniques cannot produce durable aluminum/indium antimonide heterostructures. The resulting aluminum indium antimonide/indium antimonide structure does not exhibit desirable formation of non-abelian anyons regions. Accordingly, there has been little development in the use of aluminum/indium antimonide hybrid heterostructures for quantum computing applications.

In theory, indium antimonide may provide superior performance over indium arsenide in a hybrid heterostructure including aluminum as the superconductor for quantum computing applications (e.g., due to its larger Lande g-factor). However, as stated above, conventional manufacturing practices do not produce durable aluminum/indium antimonide hybrid heterostructures. Accordingly, there is a need for a durable hybrid heterostructure including aluminum and indium antimonide and methods for manufacturing the same.

SUMMARY

In one exemplary embodiment, a hybrid heterostructure includes a semiconductor layer comprising indium antimonide, a superconductor layer comprising aluminum, and a screening layer between the semiconductor layer and the superconductor layer, the screening layer comprising indium arsenide. By including a screening layer of indium arsenide between the semiconductor layer of indium antimonide and the superconductor layer of aluminum, a high-performance and durable hybrid heterostructure suitable for use in quantum computing devices is provided.

In one exemplary embodiment, a method for manufacturing a hybrid heterostructure includes providing a semiconductor layer comprising indium antimonide, providing a superconductor layer comprising aluminum, and providing a screening layer comprising indium arsenide between the semiconductor layer and the superconductor layer. By providing the screening layer of indium arsenide between the semiconductor layer of indium antimonide and the superconductor layer comprising aluminum, a high-performance and durable hybrid heterostructure suitable for use in quantum computing devices is provided.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIGS. 3A through 3C illustrate the method of FIG. 2 for manufacturing a hybrid heterostructure according to one embodiment of the present disclosure.

DETAILED DESCRIPTION

Figure 1:
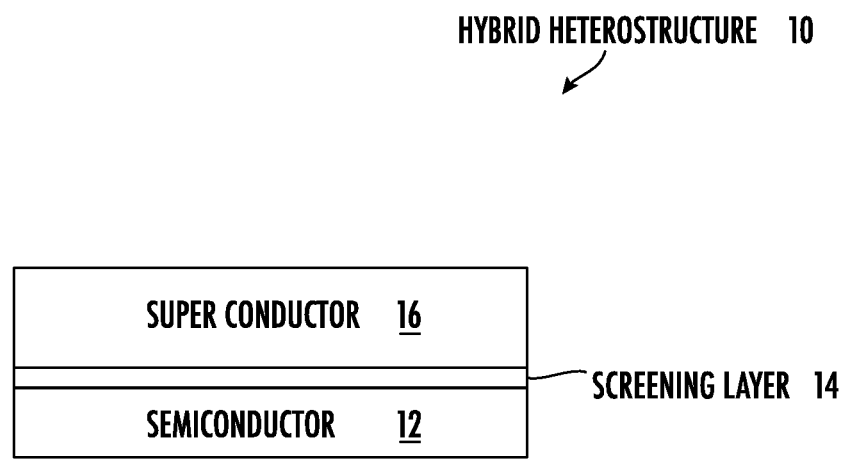
FIG. 1 shows a hybrid heterostructure including a screening layer according to one embodiment of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

As discussed above, while hybrid heterostructures including indium antimonide and aluminum show promise for quantum computing applications such as topological qubits, it has thus far been a challenge to manufacture a durable hybrid heterostructure using these materials due to the interaction between them. Accordingly, FIG. 1 shows a hybrid heterostructure 10 according to one embodiment of the present disclosure. The hybrid heterostructure 10 includes a semiconductor layer 12, a screening layer 14 on the semiconductor layer 12, and a superconductor layer 16 on the screening layer 14. The semiconductor layer 12 comprises indium antimonide, and in some embodiments consists only of indium antimonide. In one or more additional embodiments, the semiconductor layer 12 comprises aluminum indium antimonide ($In_xAl_{1-x}Sb$). The superconductor layer 16 comprises aluminum, and in some embodiments consists only of aluminum. The screening layer 14 comprises indium arsenide, and in some embodiments consists only of indium arsenide. By including the screening layer 14 between the semiconductor layer 12 and the superconductor layer 16, interactions between the semiconductor layer 12 and the superconductor layer 16 may be reduced or eliminated. Accordingly, the material of the screening layer 14 is chosen such that it does not interact with either the semiconductor layer 12 or the superconductor layer 16. In the embodiment discussed above, indium arsenide does not significantly interact with either indium antimonide or aluminum, and thus providing the screening layer 14 maintains the interface between the semiconductor layer 12, the screening layer 14, and the superconductor layer 16. As discussed above, without the screening layer 14 the aluminum would react with the indium antimonide such that the aluminum as consumed to form aluminum indium antimonide, which is undesirable. Accordingly, an indium arsenide screening layer drastically improves the durability of an indium antimonide/aluminum hybrid heterostructure.

A thickness of the screening layer 14 may be very small, for example, less than 10 monolayers, more preferably less than 5 monolayers, and most preferably 2 monolayers. The thinner the screening layer 14 is, the less that it will affect the operation of the main materials used in the hybrid heterostructure 10. Accordingly, it is desirable to minimize the thickness of the screening layer 14. In the embodiment discussed above, the indium arsenide is so thin that it barely affects the operation of the indium antimonide/aluminum heterostructure, yet still functions to drastically improve the durability thereof. The semiconductor layer 12 may form a nanowire in some embodiments. Accordingly, a thickness of the semiconductor layer 12 may be between 1 nm and 10 nm, a width of the semiconductor layer 12 may be between 50 nm and 200 nm, and a length of the semiconductor layer 12 may be on the order of microns. The semiconductor layer 12 may therefore form a quasi-1D such that only the lowest sub-band is occupied in the thickness direction, while weaker confinement in the width direction provides a few occupied sub-bands. A thickness of the superconductor layer 16 may be between 5 nm and 40 nm.

While the hybrid heterostructure 10 is shown in isolation for purposes of illustration, the hybrid heterostructure 10 may be integrated into any number of known structures (e.g., a nanowire array), provided on a substrate, or included among any number of other layers to form a functional quantum computing device.

Figure 2:
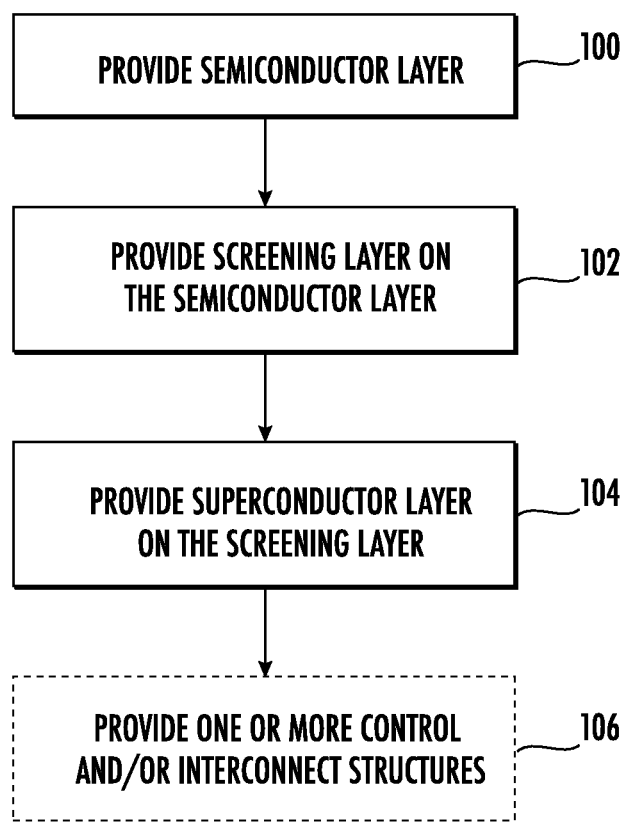
FIG. 2 is a flow diagram illustrating a method for manufacturing a hybrid heterostructure according to one embodiment of the present disclosure.
Figure 3B:
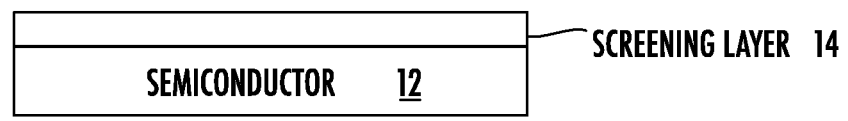
Figure 3C:
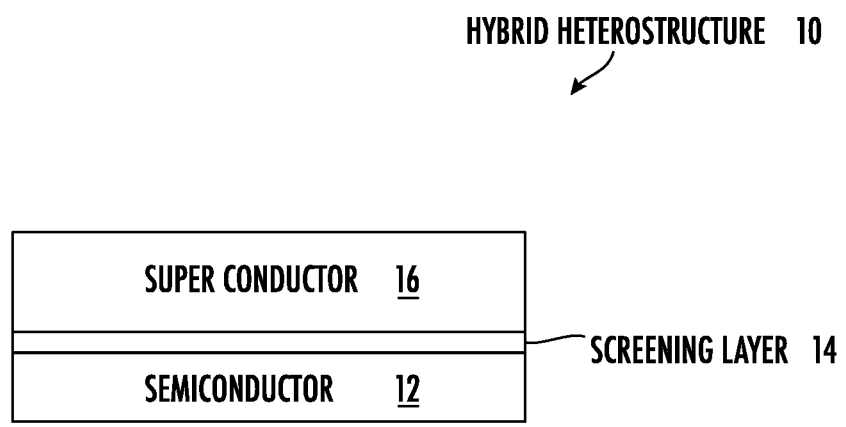

FIG. 2 is a flow diagram illustrating a method for manufacturing the hybrid heterostructure 10 according to one embodiment of the present disclosure. FIGS. 3A through 3C illustrate the various steps of the method illustrated in FIG. 2 and thus FIG. 2 and FIGS. 3A through 3C are discussed together below. The semiconductor layer 12 is provided (block 100 and FIG. 3A). Notably, the semiconductor layer 12 can be provided by any suitable means. In one example, the semiconductor layer 12 is provided by an epitaxy process such as molecular beam epitaxy. Further, the semiconductor layer 12 may be selectively grown, for example, by a selective area grown (SAG) process such as the one described in international patent publication number WO 2019/074557 A1, the contents of which are hereby incorporated by reference in their entirety. Using a SAG process to form the semiconductor layer 12 allows the semiconductor layer 12 to be formed as a nanowire, which may be useful in the formation of quantum computing devices such as a topological qubit.

The screening layer 14 is provided on the semiconductor layer (block 102 and FIG. 3B). The screening layer 12 may be provided by any suitable means. For example, the screening layer 12 may be provided by an epitaxy process such as molecular beam epitaxy.

The superconductor layer 16 is provided on the screening layer (block 104 and FIG. 3C). The superconductor layer 16 may be provided by any suitable means. For example, the superconductor layer 16 may be provided by a deposition process such as chemical vapor deposition, sputtering, etc.

Notably, the semiconductor layer 12, the screening layer 14, and the superconductor layer 16 may be provided in any order. For example, in one embodiment the screening layer 14 is provided on the superconductor layer 16 and the semiconductor layer 12 is provided on the screening layer. Different manufacturing techniques may necessitate providing the semiconductor layer 12, the screening layer 14, and the superconductor layer 16, all of which are contemplated herein.

Optionally, one or more control and/or interconnect structures may then be provided such that they are coupled to or otherwise near one or more of the semiconductor layer 12, the screening layer 14, and the superconductor layer 16 (block 106). These control and/or interconnect structures may enable certain functionality of the hybrid heterostructure 10, for example, as a topological qubit.

Figure 4:
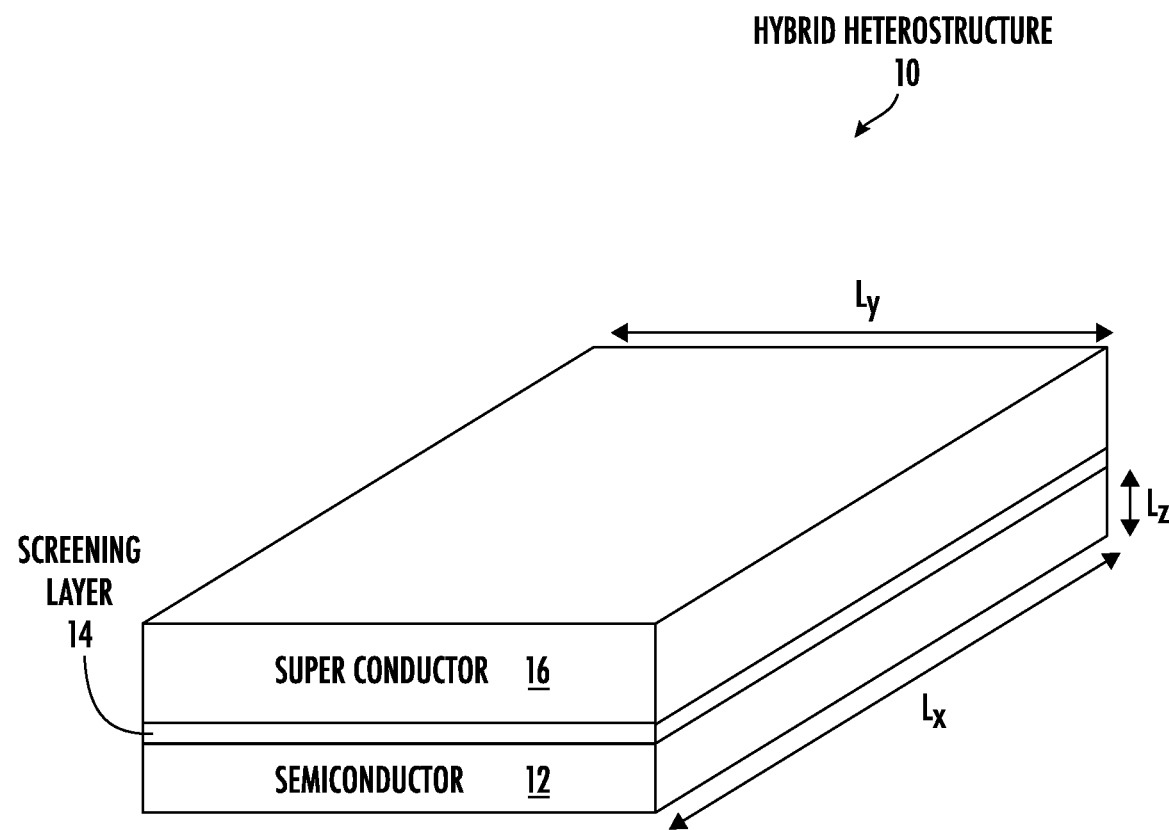
FIG. 4 illustrates a hybrid heterostructure according to one embodiment of the present disclosure.

FIG. 4 shows a three-dimensional representation of the hybrid heterostructure 10 according to one embodiment of the present disclosure. As discussed above, the semiconductor layer 12 may form a nanowire. Accordingly, a thickness ($L_z$) of the semiconductor layer 12 may be between 1 nm and 10 nm, a width ($L_y$) of the semiconductor layer 12 may be between 50 nm and 200 nm, and a length ($L_x$) of the semiconductor layer 12 may be on the order of microns, in particular 1 µm or more. More generally, the dimensions of the semiconductor layer 12, the screening layer 14, and the superconductor layer 16 are chosen to provide regions of non-abelian anyons that can be used for the creation of quantum computing devices such as a topological qubit.

Figure 5:
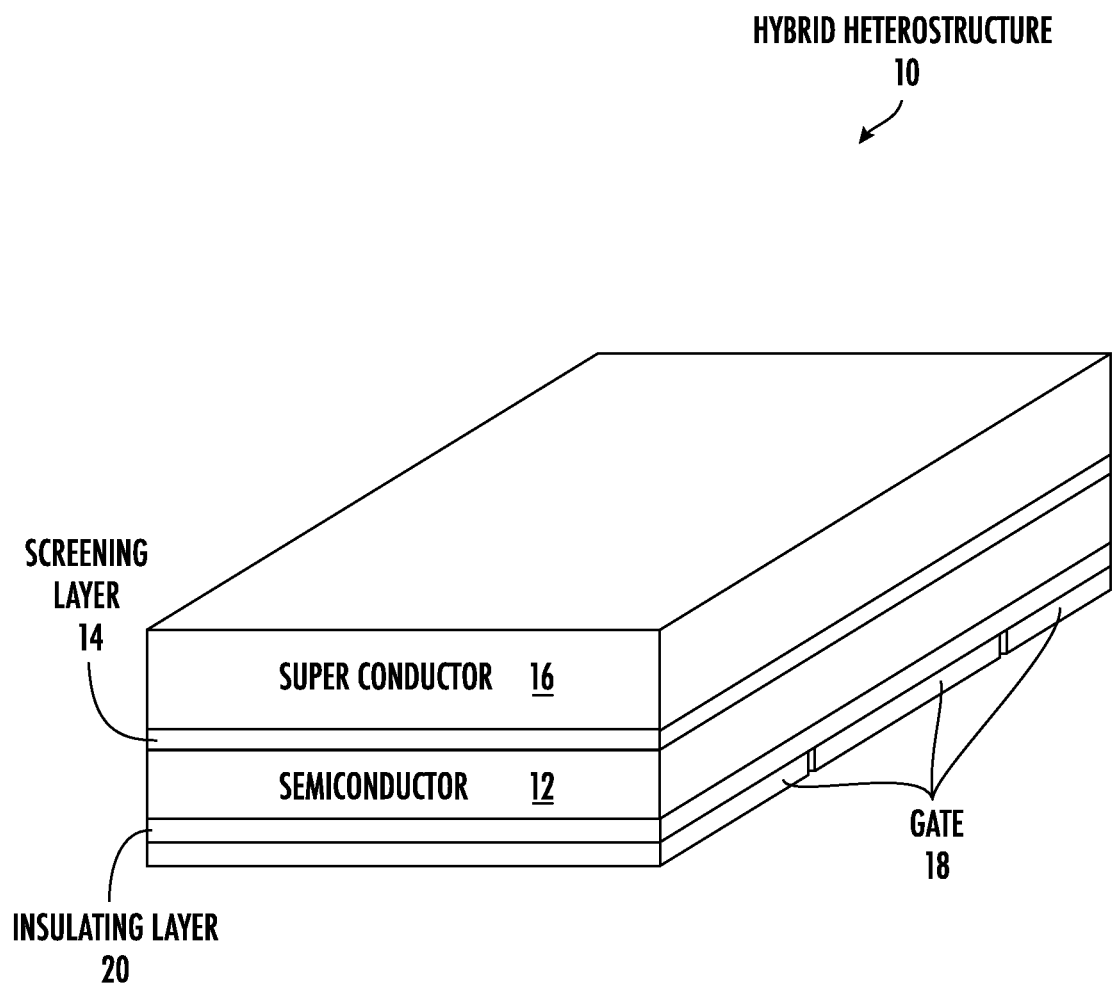
FIG. 5 illustrates a hybrid heterostructure including one or more control structures according to one embodiment of the present disclosure.

FIG. 5 shows the hybrid heterostructure 10 including a number of control structures for manipulating a behavior thereof according to one embodiment of the present disclosure. In particular, FIG. 5 shows the hybrid heterostructure 10 including a number of gates 18, which are separated from a bottom side of the semiconductor layer 12 by an insulating layer 20. The gates 18 may comprise a metal layer such as aluminum, titanium, gold, or the like. The insulating layer 20 may comprise an oxide layer such as aluminum oxide. The gates 18 may be used to selectively provide an electric field to the hybrid heterostructure 10, which may induce changes to the chemical potential thereof and thus change portions thereof between topological phase (i.e., having Majorana modes) and non-topological phase (i.e., having no Majorana modes). Further details about the gate structures and how they may be used to control the hybrid heterostructure 10 to provide a topological qubit are described in U.S. Pat. No. 9,040,959 B2, the contents of which are hereby incorporated by reference in their entirety.

Figure 6:
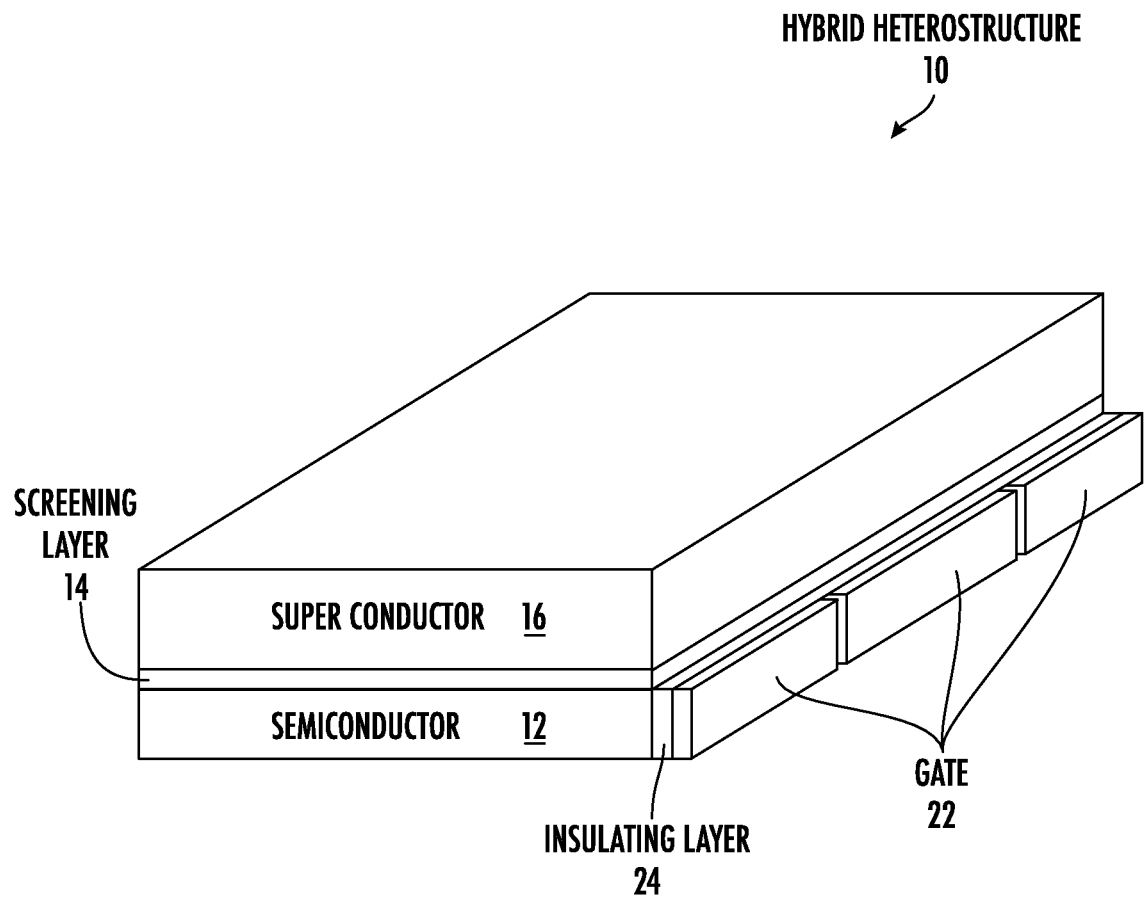
FIG. 6 illustrates a hybrid heterostructure including one or more control structures according to one embodiment of the present disclosure.

FIG. 6 shows the hybrid heterostructure 10 including a number of control structures for manipulating the behavior thereof according to an additional embodiment of the present disclosure. In particular, FIG. 6 shows the hybrid heterostructure 10 including a number of gates 22, which are separated from a side of the semiconductor layer 12 by an insulating layer 24. Notably, the gates 22 shown in FIG. 6 are located along a thickness of the semiconductor layer 12, while the gates 18 shown in FIG. 5 are located along a width of the semiconductor layer 12. Sometimes referred to as "side gates" and "top gates", these gates may affect the behavior of the hybrid heterostructure 10 differently and thus may be used to control different aspects of the behavior thereof.

Notably, many other control and/or interconnect structures, as well as supporting substrates, interlayers, and the like may be provided along with the hybrid heterostructure 10 to provide a quantum computing device such as a topological qubit. As discussed above, indium antimonide shows great promise for quantum computing applications due to its large spin-orbit interaction strength and large Lande g-factor. Further, aluminum is a preferred superconductor for quantum computing applications. By providing a screening layer of indium arsenide between indium antimonide and aluminum, a high performance and durable hybrid heterostructure is provided that may provide high performance in quantum computing devices.

Those skilled in the art will recognize improvements and modifications to the preferred embodiments of the present disclosure. All such improvements and modifications are considered within the scope of the concepts disclosed herein and the claims that follow.

What is claimed is:
1. A hybrid heterostructure comprising:
   a semiconductor layer only comprising indium antimonide or aluminum indium antimonide;
   a superconductor layer comprising aluminum; and
   a screening layer between the semiconductor layer and the superconductor layer, the screening layer only comprising indium arsenide.
2. The hybrid heterostructure of claim 1 wherein a thickness of the screening layer is less than 10 monolayers.
3. The hybrid heterostructure of claim 2 wherein the thickness of the screening layer is less than 5 monolayers.
4. The hybrid heterostructure of claim 3 wherein the thickness of the screening layer is 2 monolayers.
5. The hybrid heterostructure of claim 4 wherein the semiconductor layer forms a nanowire such that a width of the semiconductor layer is between 50 nm and 200 nm and a thickness of the semiconductor layer is between 1 nm and 10 nm.
6. The hybrid heterostructure of claim 5 wherein a thickness of the superconducting layer is between 5 nm and 40 nm.
7. The hybrid heterostructure of claim 4 wherein the semiconductor layer only comprises aluminum indium antimonide.
8. The hybrid heterostructure of claim 1 wherein the semiconductor layer forms a nanowire such that a width of the semiconductor layer is between 50 nm and 200 nm and a thickness of the semiconductor layer is between 1 nm and 10 nm.

9. The hybrid heterostructure of claim 8 wherein a thickness of the superconducting layer is between 5 nm and 40 nm.

10. The hybrid heterostructure of claim 1 wherein the semiconductor layer only comprises aluminum indium antimonide.

11. A method for manufacturing a hybrid heterostructure comprising:
providing a semiconductor layer only comprising indium antimonide or aluminum indium antimonide;
providing a superconductor layer, the superconductor layer comprising aluminum; and
providing a screening layer between the semiconductor layer and the superconductor layer, the screening layer only comprising indium arsenide.

12. The method of claim 11 wherein the screening layer is provided such that a thickness of the screening layer is less than 10 monolayers.

13. The method of claim 12 wherein the screening layer is provided such that a thickness of the screening layer is less than 5 monolayers.

14. The method of claim 13 wherein the screening layer is applied such that a thickness of the screening layer is 2 monolayers.

15. The method of claim 14 wherein the semiconductor layer is provided such that the semiconductor layer forms a nanowire wherein a width of the semiconductor layer is between 50 nm and 200 nm and a thickness of the semiconductor layer is between 1 nm and 10 nm.

16. The method of claim 15 wherein the superconducting layer is provided such that a thickness of the superconducting layer is between 5 nm and 40 nm.

17. The method of claim 14 wherein the semiconductor layer only comprises aluminum indium antimonide.

18. The method of claim 11 wherein the semiconductor layer is provided such that the semiconductor layer forms a nanowire wherein a width of the semiconductor layer is between 50 nm and 200 nm and a thickness of the semiconductor layer is between 1 nm and 10 nm.

19. The method of claim 18 wherein the superconducting layer is provided such that a thickness of the superconducting layer is between 5 nm and 40 nm.

20. The method of claim 11 wherein the semiconductor layer only comprises aluminum indium antimonide.

* * * * *